United States Patent
Co et al.

(10) Patent No.: US 8,022,720 B2
(45) Date of Patent: *Sep. 20, 2011

(54) PARKING STRUCTURE MEMORY-MODULE TESTER THAT MOVES TEST MOTHERBOARDS ALONG A HIGHWAY FOR REMOTE LOADING/UNLOADING

(75) Inventors: Ramon S. Co, Trabuco Canyon, CA (US); Kevin J. Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/941,196

(22) Filed: Nov. 8, 2010

(65) Prior Publication Data

US 2011/0050268 A1    Mar. 3, 2011

Related U.S. Application Data

(63) Continuation of application No. 12/392,401, filed on Feb. 25, 2009, now Pat. No. 7,884,631.

(51) Int. Cl.
*G01R 31/02* (2006.01)
(52) U.S. Cl. .............................. 324/757.01; 324/757.04
(58) Field of Classification Search .................. None
See application file for complete search history.

(56) References Cited

U.S. PATENT DOCUMENTS

| | | | | |
|---|---|---|---|---|
| 3,371,780 | A * | 3/1968 | Clark | 209/3.1 |
| 7,117,405 | B2 * | 10/2006 | Co et al. | 714/718 |
| 7,197,676 | B2 * | 3/2007 | Co et al. | 714/718 |
| 7,884,631 | B2 * | 2/2011 | Co et al. | 324/757.01 |

* cited by examiner

*Primary Examiner* — Vinh Nguyen
(74) *Attorney, Agent, or Firm* — Stuart T. Auvinen; gPatent LLC

(57) ABSTRACT

A parking-structure test system has motherboards that test memory modules. The motherboards are not stationary but are placed inside movable trays that move along conveyors. An unloader removes tested memory modules from test sockets on the motherboards, and a loader inserts untested memory modules into the motherboards using a robotic arm. A conveyor carries the motherboards from the loader to a parking and testing structure. An elevator raises or lowers the motherboards to different parking levels in the parking and testing structure. The motherboards move from the elevator to test stations on the parking level. A retractable connector from the test station makes contact with a motherboard connector to power up the motherboard, which then tests the memory modules. Test results are communicated from the test station to a host controller, which instructs the loader-unloader to sort the tested memory modules once the motherboard returns via the elevator and conveyors.

20 Claims, 16 Drawing Sheets

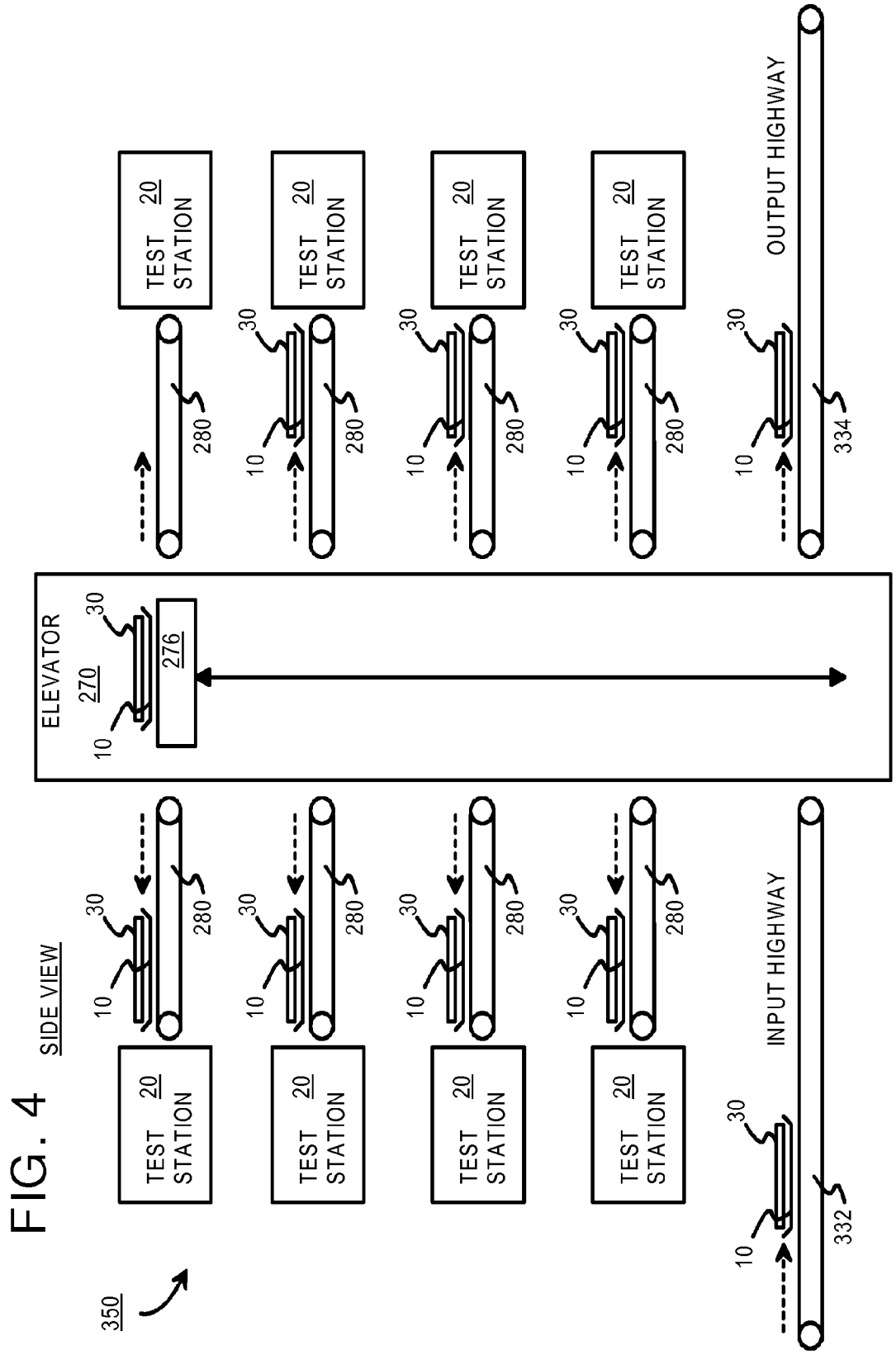

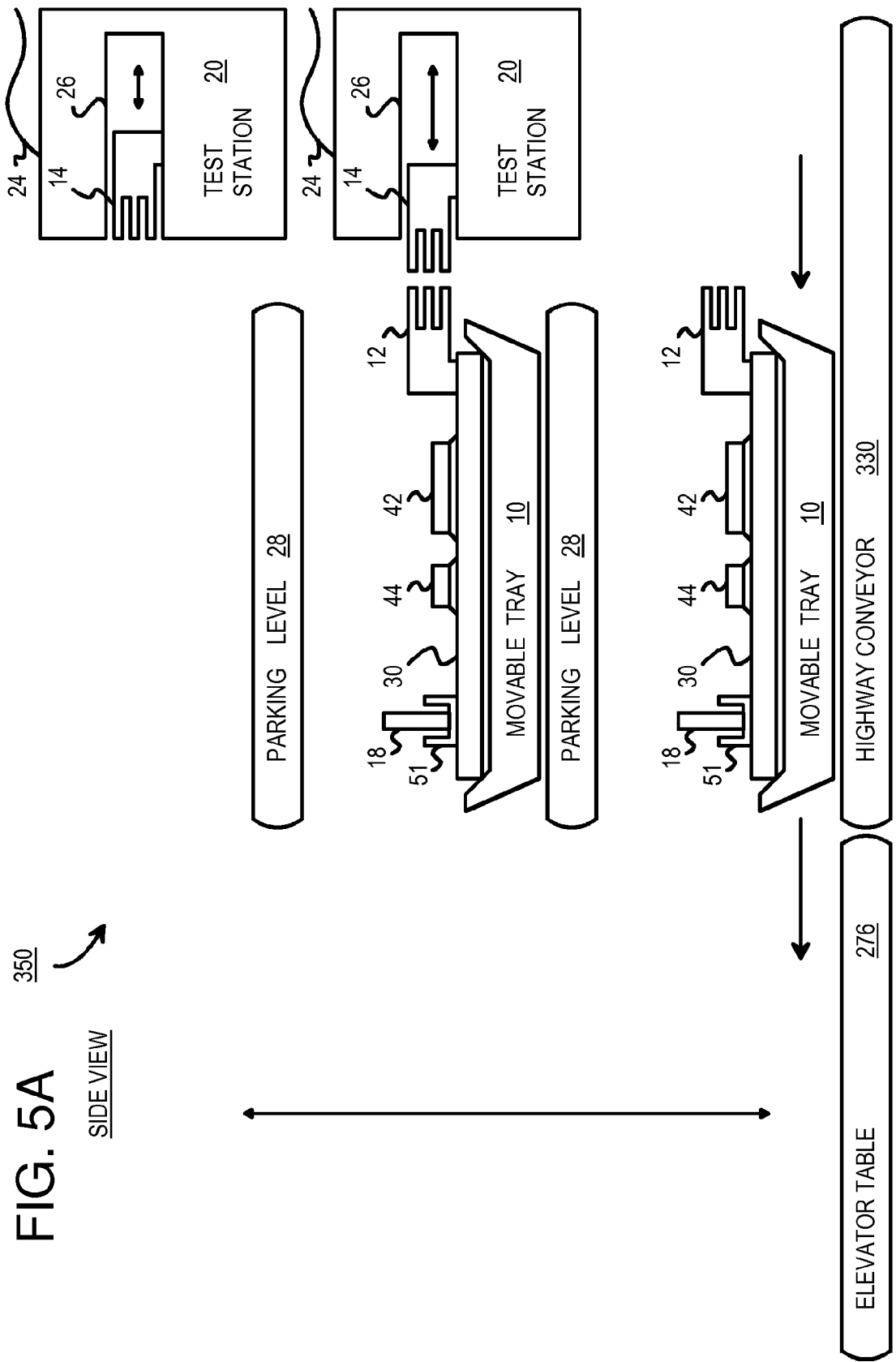

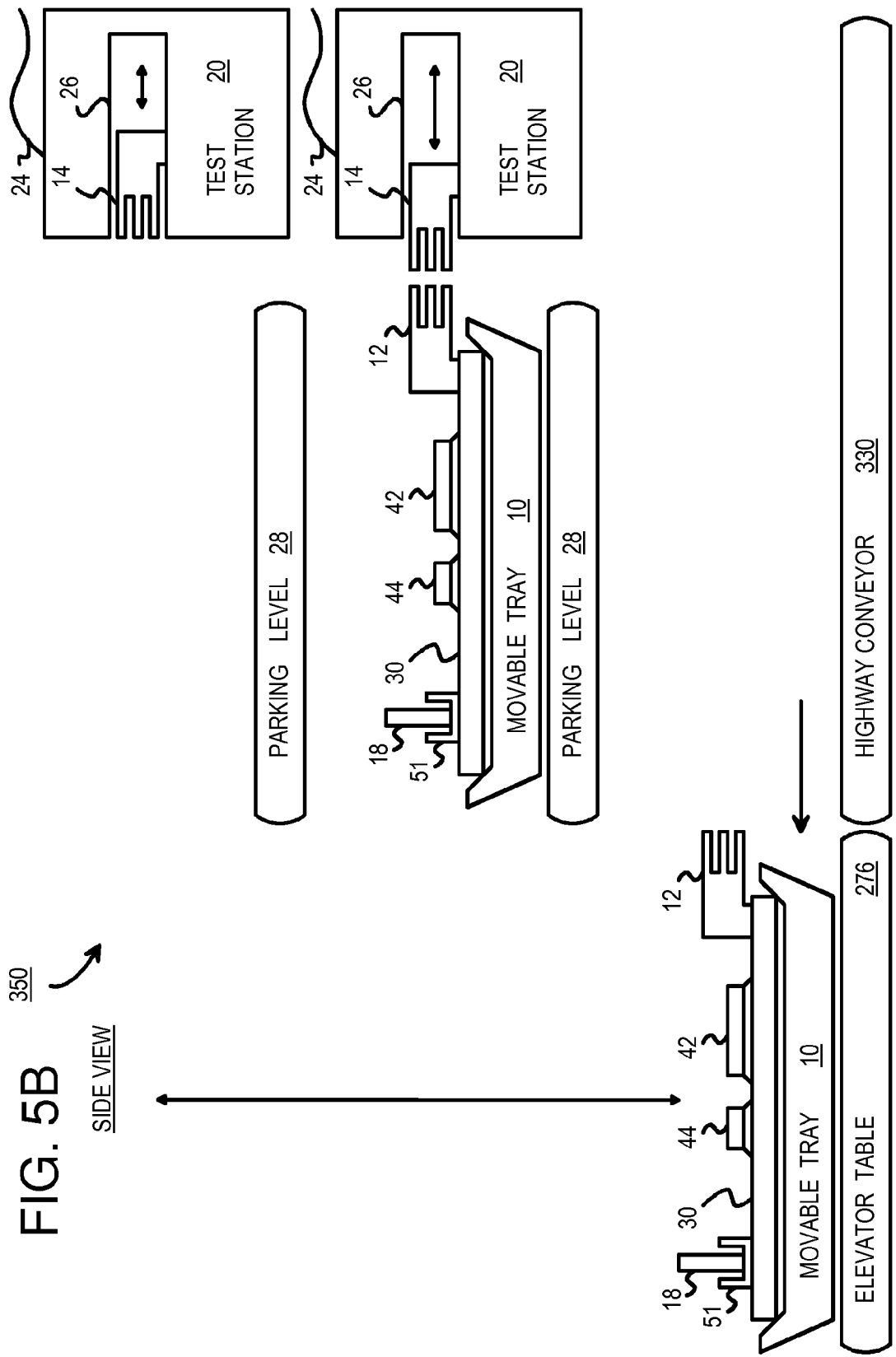

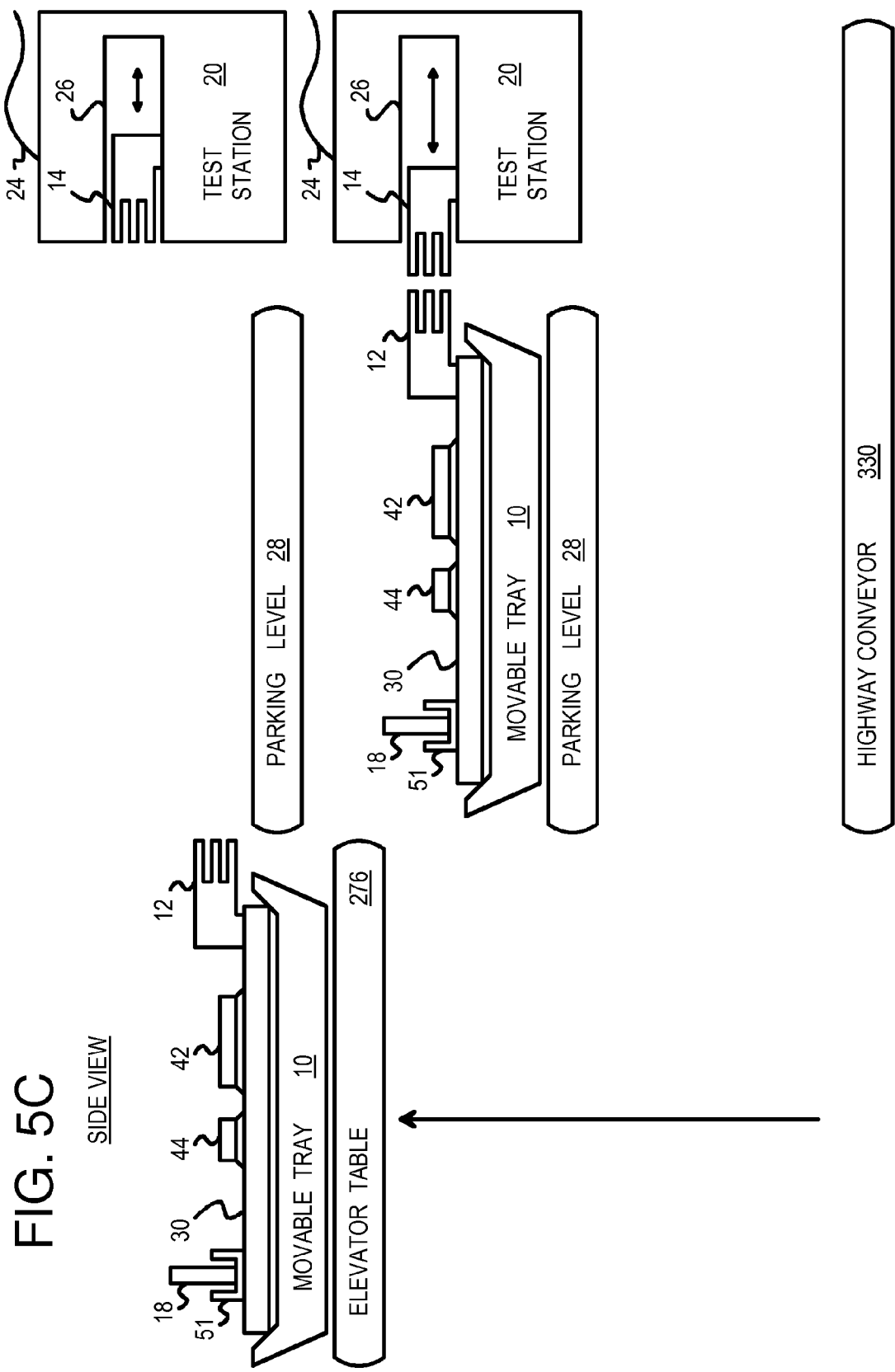

SIDE VIEW

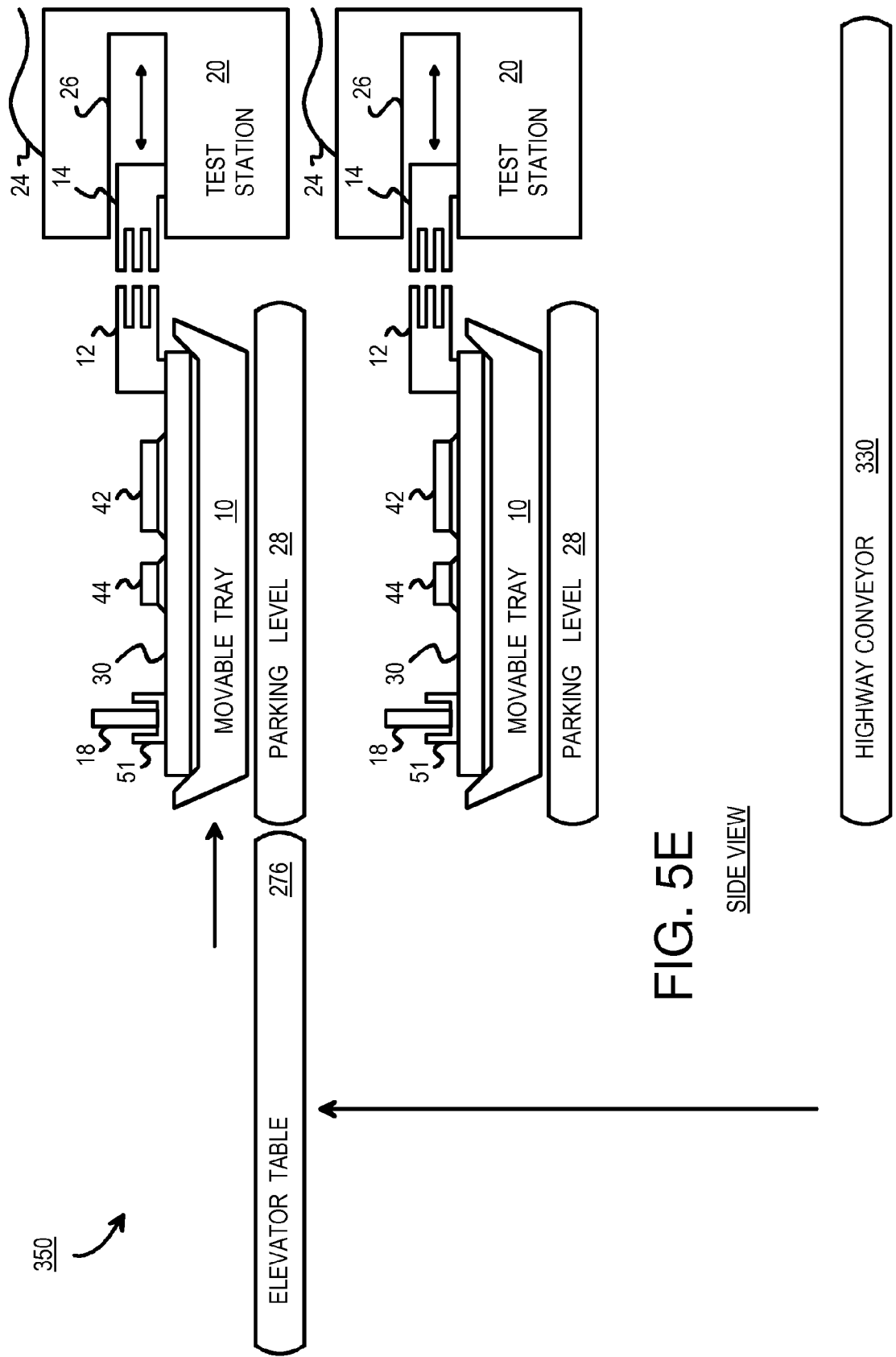
FIG. 5E SIDE VIEW

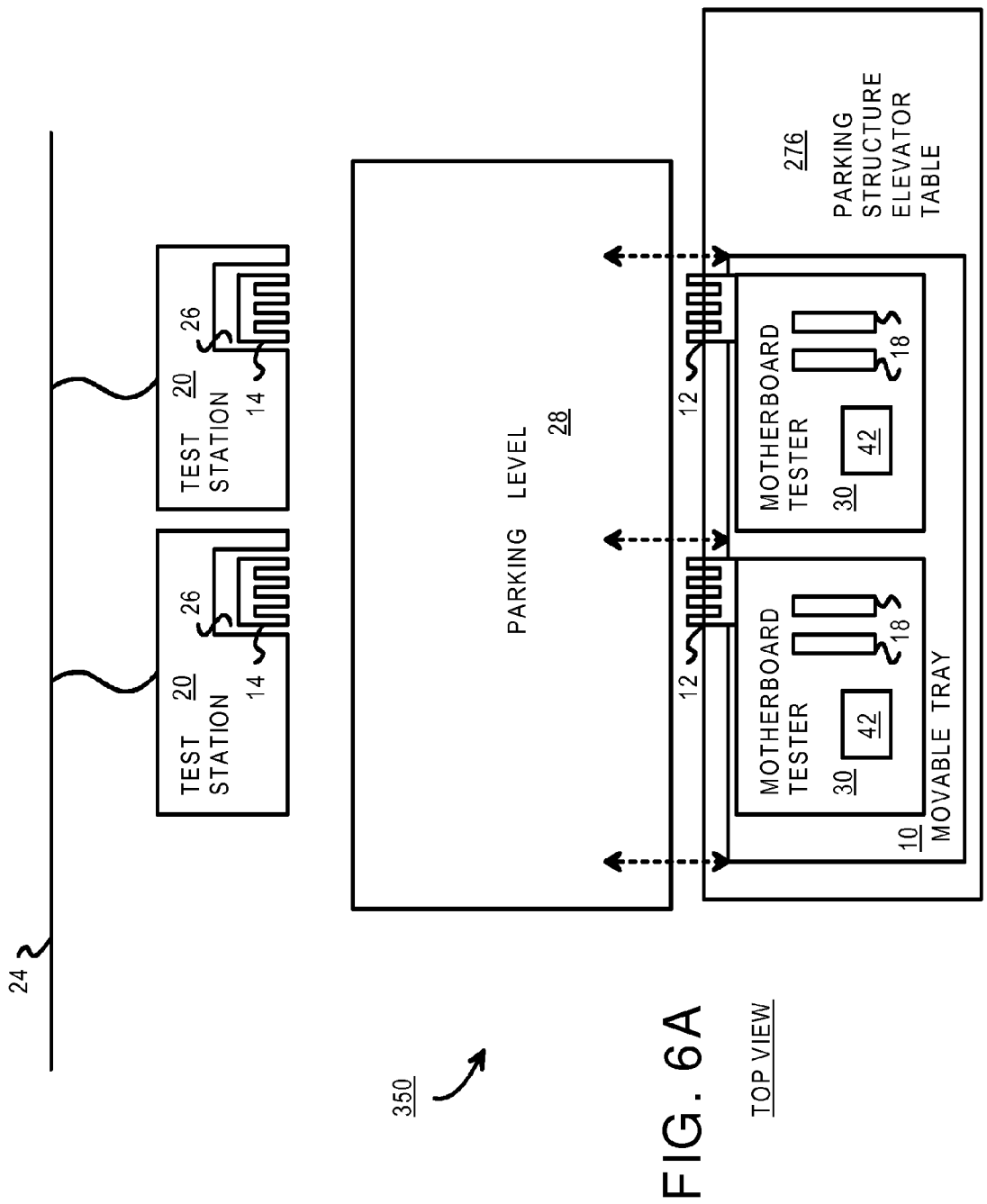

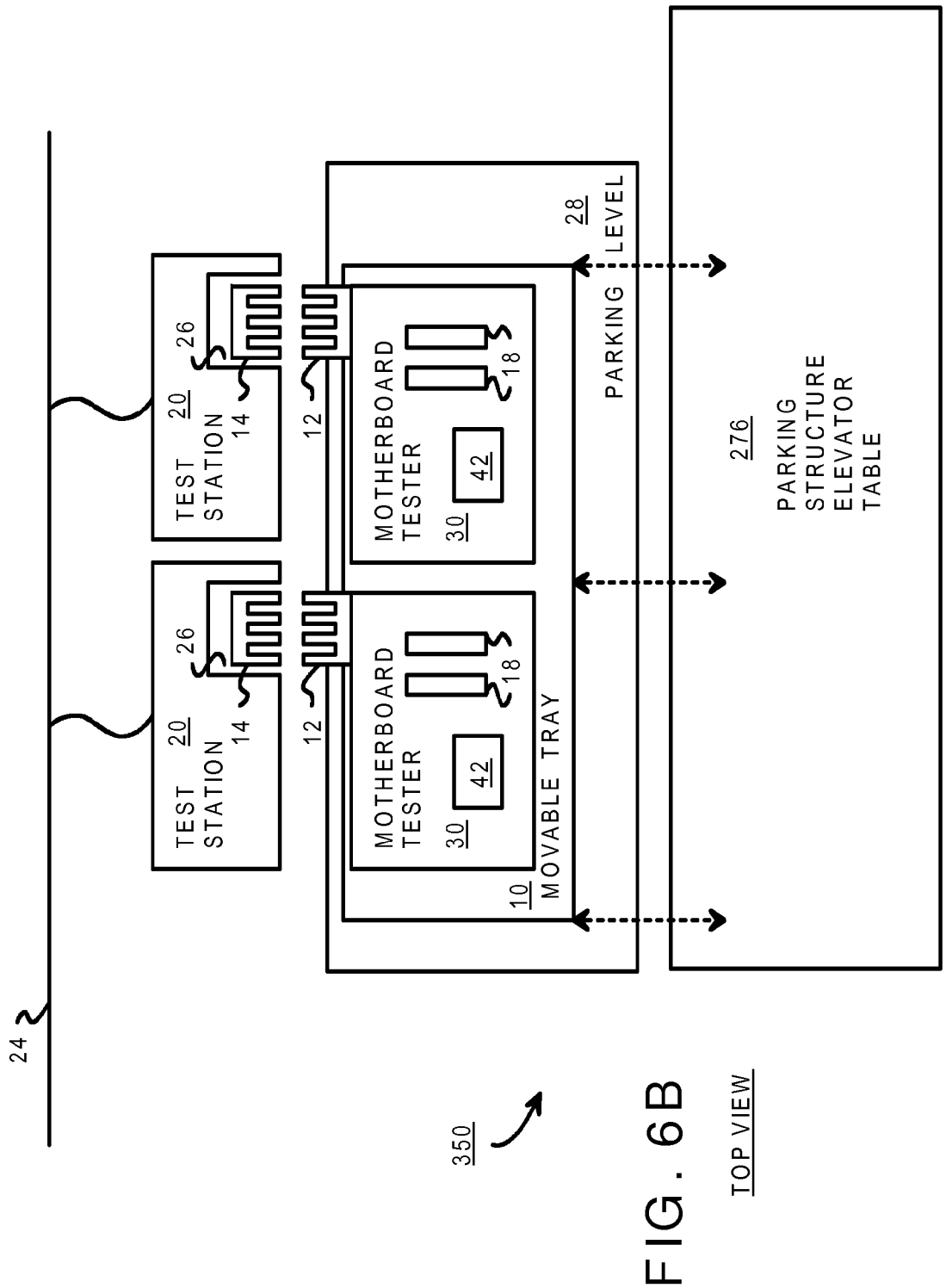

TOP VIEW

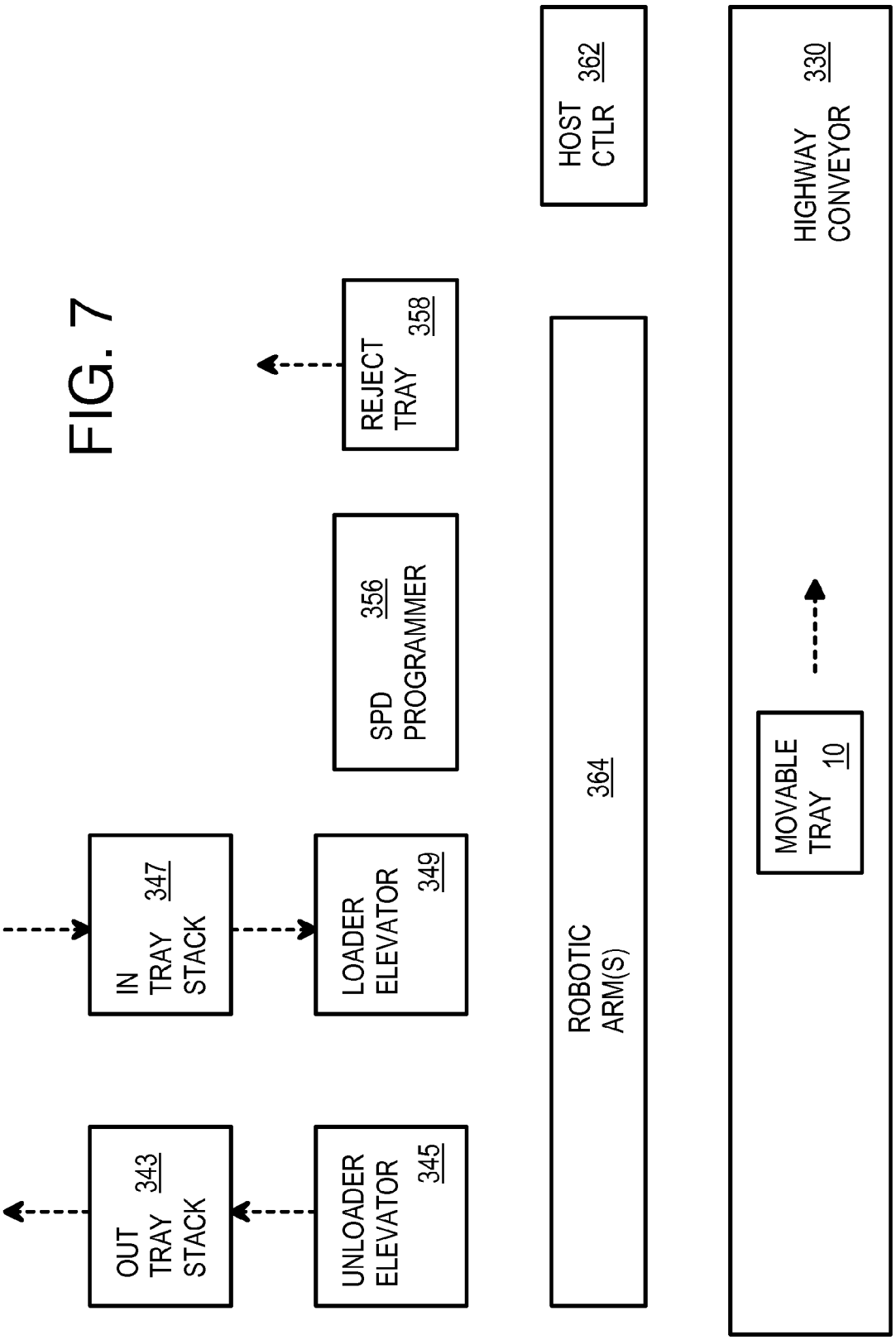

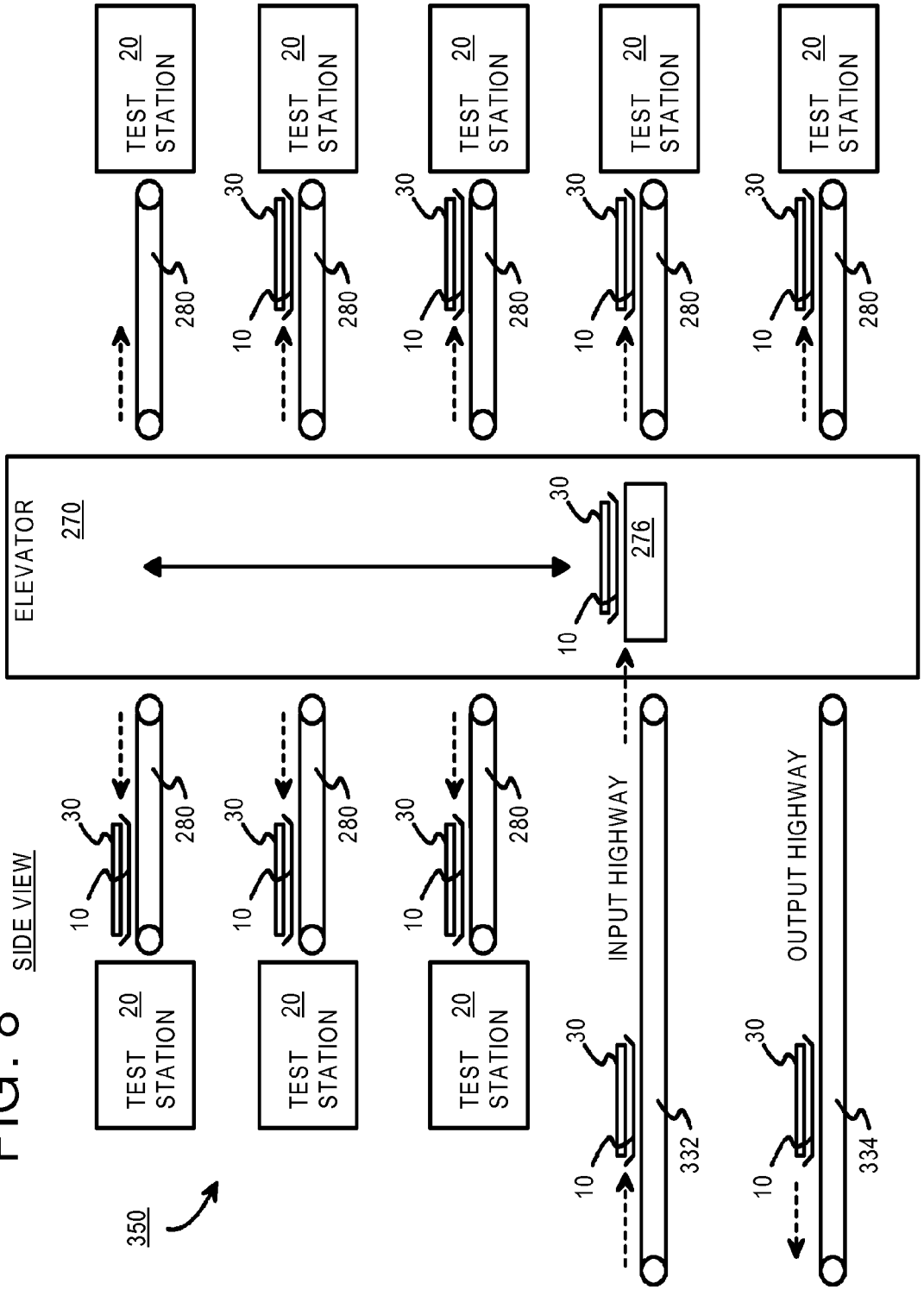

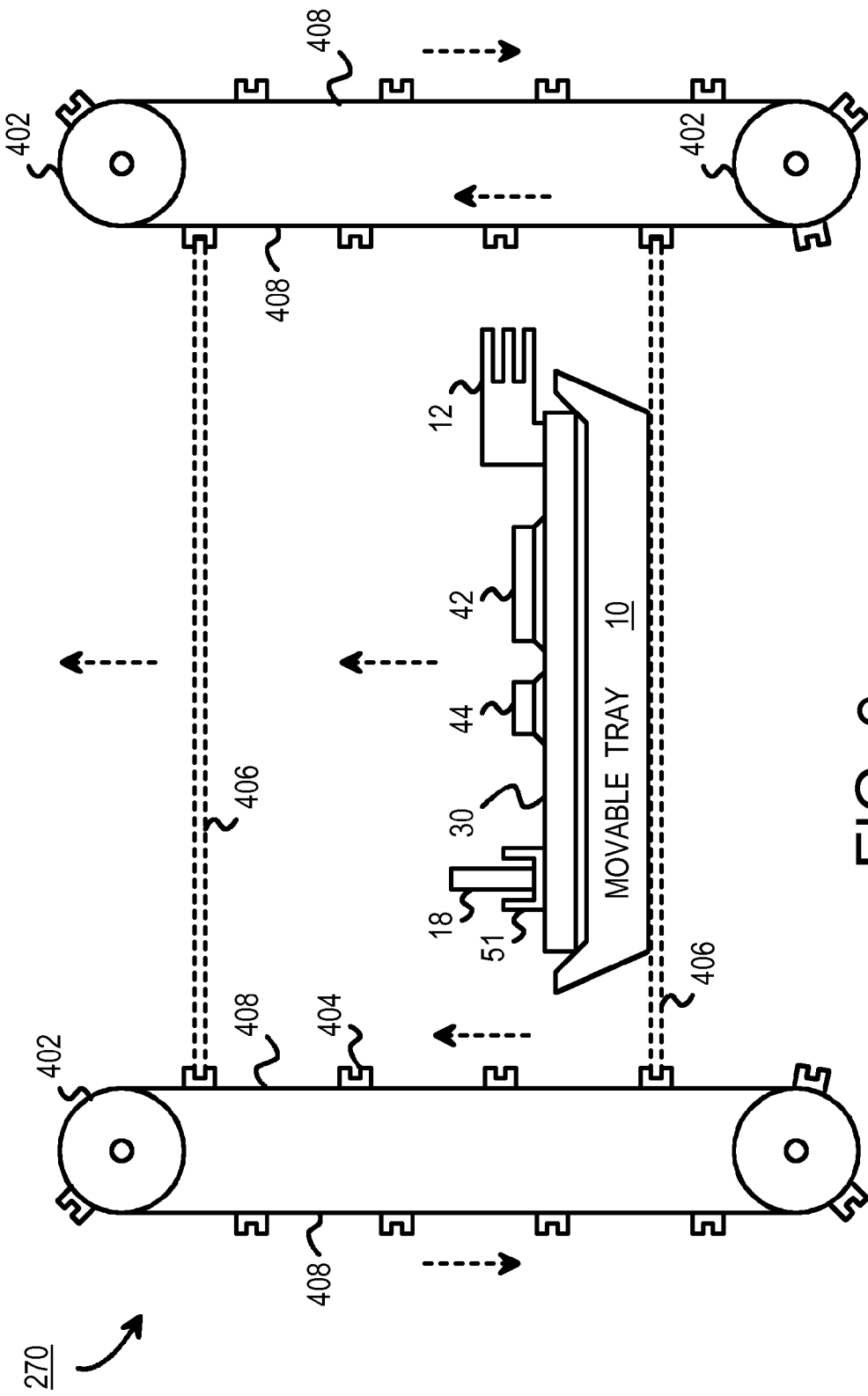
FIG. 9  SIDE VIEW

SIDE VIEW

US 8,022,720 B2

PARKING STRUCTURE MEMORY-MODULE TESTER THAT MOVES TEST MOTHERBOARDS ALONG A HIGHWAY FOR REMOTE LOADING/UNLOADING

RELATED APPLICATION

This application is a continuation of U.S. Ser. No. 12/392,401 filed Feb. 25, 2009, now U.S. Pat. No. 7,884,631.

FIELD OF THE INVENTION

This invention relates to electronic-test systems, and more particularly to test system with movable test motherboards that are moved from a loader to a vertical parking structure for testing memory modules including SIMMs and DIMMs.

BACKGROUND OF THE INVENTION

Memory is a fundamental part of many digital electronic systems. A variety of electronic systems including personal computers (PCs) use DRAM memory chips mounted on small, removable memory modules. Older single-inline memory modules (SIMMs) have been replaced with dual-inline memory modules (DIMMs), and 184-pin RIMMs (Rambus inline memory modules) and 184-pin DDR (double data rate) DIMMs. New kinds of memory modules continue to be introduced.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test. Handlers have also been developed for memory modules.

Rather than use an expensive general-purpose I.C. tester, inexpensive testers based on PC motherboards have been developed. These motherboard-based testers cost only about $10K while replacing a quarter-million-dollar I.C. tester. The memory module to be tested is inserted into a test socket on a test adapter board (daughter card) mounted on the back-side of the motherboard. Special handlers can be used for module insertion.

Elevated-temperature testing is often desired to more thoroughly screen for defects. Hot air can be blown onto the memory module being tested. Ideally, the motherboard itself is cooled while the memory module under test is heated. See U.S. Pat. No. 6,357,023 for "Connector Assembly for Testing Memory Modules from the Solder-Side of a PC Motherboard with Forced Hot Air".

FIG. 1 highlights a motherboard-based memory tester. A conventional PC motherboard is mounted upside-down within chassis 60. Rather than connect motherboard substrate 30 directly to chassis 60, as in a conventional PC, motherboard substrate 30 is mounted to metal plate 64 by standoffs or spacers 61. Motherboard substrate 30 is not mounted directly to chassis 60 in this embodiment, although it could be in some embodiments. Screws, bolts, or clamps (not shown) can be used to secure metal plate 64 to chassis 60.

Test adapter board 50 is mounted to well 66, while well 66 is mounted to metal plate 64. Test socket 51 is mounted to test adapter board 50, while pins 52 provide electrical connection from test socket 51 to motherboard substrate 30. The memory module 18 being tested is inserted into test socket 51. Test adaptor board 50 provides electrical connection from the module-under-test (MUT) in the SIMM/DIMM test socket 51 to the leads for the removed SIMM socket on the PC motherboard.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38. SIMM/DIMM sockets 38 (hereinafter SIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for SIMM sockets 38. One or more of SIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32.

Cooling fan 71 is provided in chassis 60 to cool motherboard substrate 30 and its components 42, 44 and expansion cards 46. Even air at room temperature can be effective at cooling the motherboard if a sufficient volume of air is blown past the motherboard's components. Components such as integrated circuits heat up during operation and benefit from such cooling. Of course, reduced-temperature air could also be blown into chassis 60, such as air from outside a building in a cold climate.

Since metal plate 64 separates motherboard substrate 30 from test adapter board 50, the cooling air from cooling fan 71 is separated from any heated air blown against memory module 18 under test. Test adapter board 50 is mounted within well 66 and forms a sufficient seal to prevent the cooling air within chassis 60 from cooling memory module 18 being heated and tested.

FIG. 2 is an overhead diagram looking down on a multi-motherboard test station with overhead rails for an x-y-z robotic handler. See "Automated Multi-PC-Motherboard Memory-Module Test System with Robotic Handler and In-Transit Visual Inspection", U.S. Pat. No. 6,415,397. Operator 100 can sit in front of the test station, controlling operation with a touch-screen or keyboard. Trays of untested memory modules can include a barcode that is scanned in to main system interface 65 by operator 100 before the tray is put into input stacker 63. Robotic handler 80 then picks untested modules that are moved over to input tray 62 by stacker 63. The modules are first inserted into leakage tester 82. Modules that pass are then moved by robotic handler 80 to the test socket on the test adaptor board on the solder-side of one of motherboard substrates 30 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Each of the motherboards fits into a well in the frame of the test station. The test station has a surface at about bench-top level composed of the exposed solder sides of the motherboards in the wells in the frame. Robotic handler 80 rides on rails 92, 94 mounted above the level of the motherboards, such as above the head of a seated operator 100. Operator 100 also replaces repair tray 76 and VI tray 78 with empty trays when full.

Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

While such motherboard-based testers are useful, higher-density testers are desired that have more motherboards in a smaller amount of floor area in a manufacturing facility. While these test systems use low-cost motherboards, the motherboards are fixed in location and are stationary. The robotic arm of robotic handler 80 of FIG. 2 must have a long travel distance to reach all motherboards on the test system of FIG. 2. This increases the cost of the robotic handler. The fixed number of motherboards 30 that can be reached by robotic handler 80 limits the number of memory modules that can be tested at one time by the test system.

What is desired is a larger test system. A test system that tests memory modules on motherboards is desirable to reduce cost. It is further desired to test memory modules using more motherboards than can be reached by the robotic arm.

It is desired to move motherboards using a conveyor and elevator system so that motherboards may perform testing at a structure located away from robotic handlers, thus increasing the number of motherboards that may be serviced by a robotic handler. It is desired to load and unload memory modules from motherboards when these motherboards are moved near the robotic handler, but perform testing when these motherboards are located away from the robotic handler. Thus a smaller robotic handler may be used with a large number of movable motherboards.

BRIEF DESCRIPTION OF THE DRAWINGS

FIG. 4 is a side view of a parking and testing structure.

FIGS. 5A-E are side views of raising a motherboard to a parking level for testing in a parking and testing structure.

FIGS. 6A-C are top views of testing a motherboard in a movable tray at a parking level in the parking and testing structure.

FIG. 7 shows the loader-unloader in more detail.

FIG. 8 shows an alternate embodiment of the parking and testing structure.

FIG. 9 is an elevator that raises and lowers movable motherboard-based testers.

DETAILED DESCRIPTION

The present invention relates to an improvement in motherboard-based test systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that robotic test systems are limited by the number of motherboards that can be reached by a robotic arm. The high cost of the robotic arm that inserts and removes memory modules from the motherboards increases tester and testing costs.

The inventor has further realized that the motherboards do not have to be within reach of the robotic arm while the motherboards are testing the memory modules. Some kinds of testing may require long periods of time, such as characterization and quality testing. During these long test periods, the motherboard may be moved away from the robotic arm, allowing other motherboards to be moved within range of the robotic arm. Thus one robotic arm may service many more motherboards than the few motherboards that would fit within the reach of the robotic arm. Testing throughput may be dramatically increased without increasing the cost of the robotic arm handler.

Conveyors may be used to move motherboards away from the robotic arm to a parking structure. The parking structure accepts and powers up the motherboards to perform testing. After testing is complete, the motherboards may be moved from the parking structure by the conveyor back to the robotic arm so that the tested memory modules may be removed and new untested memory modules inserted to begin the cycle anew.

Figure 3:
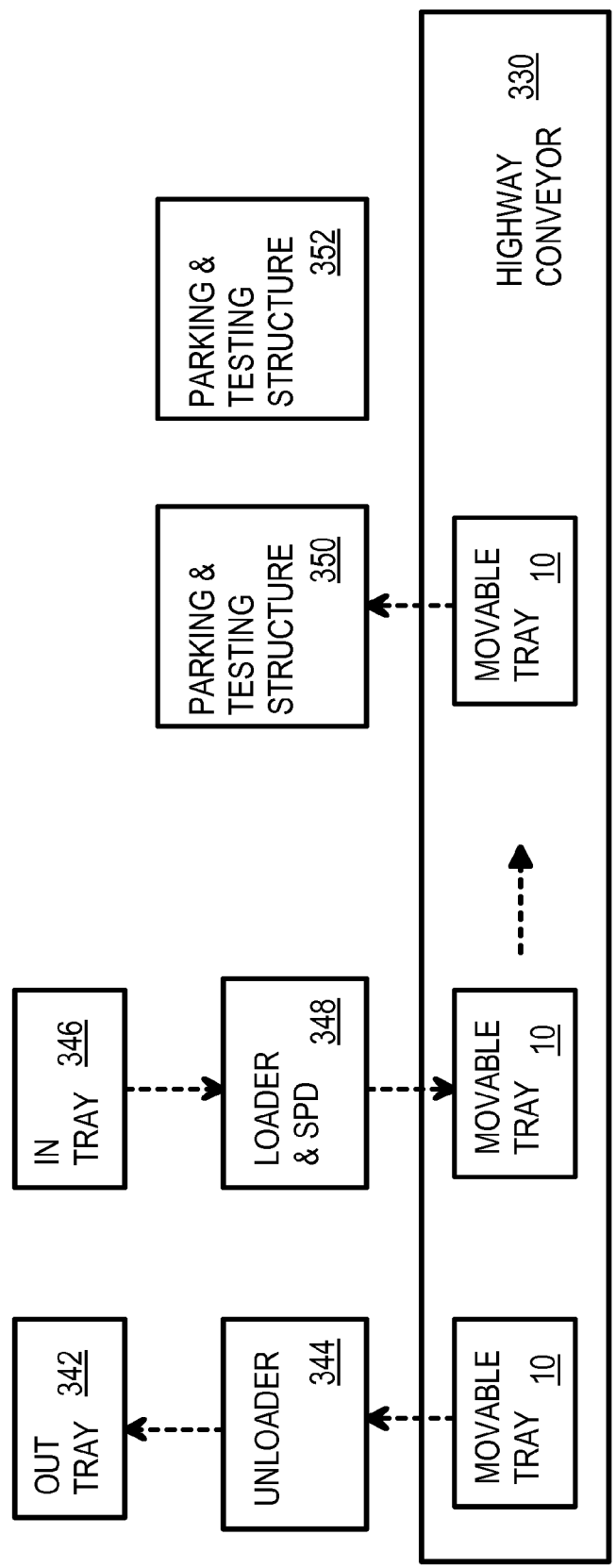
FIG. 3 is a diagram of a test system that moves motherboards from a loader-unloader to parking and testing structures where testing is performed.

FIG. 3 is a diagram of a test system that moves motherboards from a loader-unloader to parking and testing structures where testing is performed.

Untested memory modules from an assembly line are received in input trays 346 and are picked up by loader 348, which may use a robotic arm. The memory modules are tested in a simple D.C. tester for major failures such as shorts, and a serial-presence-detect electrically-erasable programmable read-only memory (SPD-EEPROM) on each memory module is programmed. The robotic arm of loader 348 then inserts passing memory modules into test sockets on motherboards that are on movable tray 10 currently near loader 348.

Figure 1:
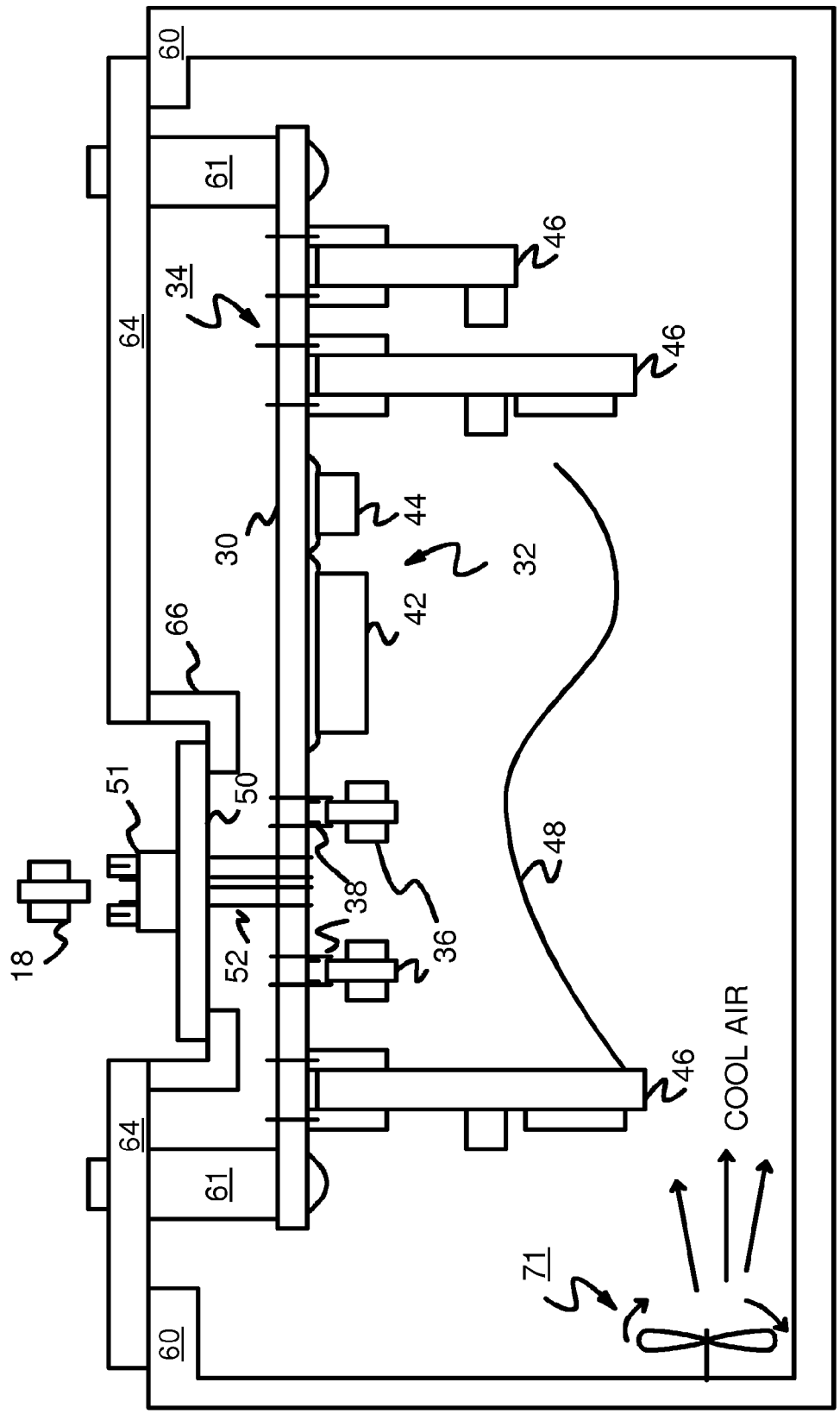
FIG. 1 highlights a motherboard-based memory tester.
Figure 2:
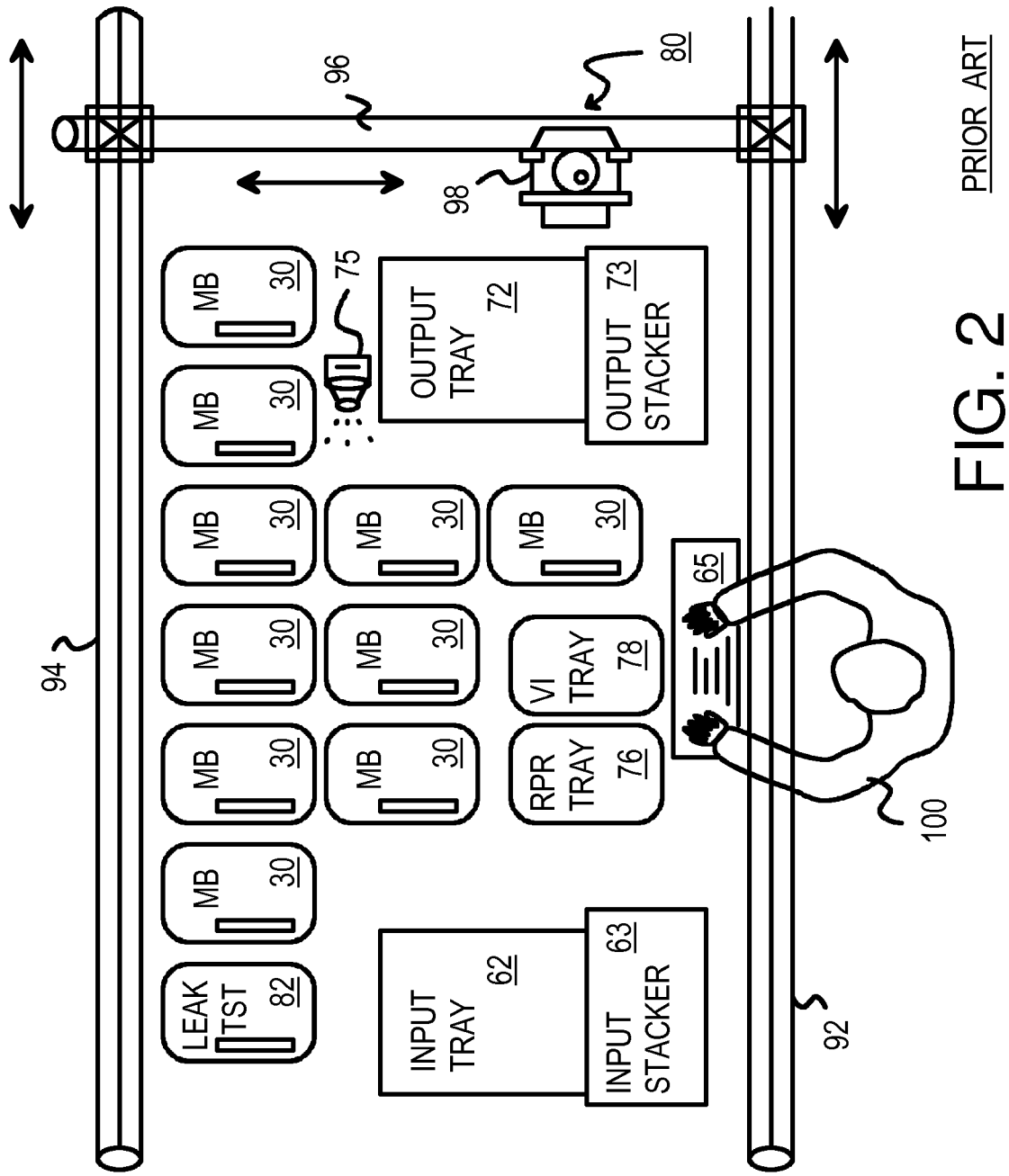
FIG. 2 is an overhead diagram looking down on a multi-motherboard test station with overhead rails for an x-y-z robotic handler.

The motherboards in movable trays 10 are each a modified personal computer (PC) motherboard with a microprocessor and other chips that use memory modules as the main memory of the motherboard. However, rather than having standard memory modules sockets, these motherboards have test sockets, and may have a small test adaptor board mounted to the motherboard, with the test sockets mounted to the test adaptor board as shown in FIG. 1. The robotic arm of loader 348 loads or inserts memory modules into the test sockets, and these memory modules in the test sockets act as the module-under-test (MUT).

Movable trays 10 have been placed on highway conveyor 330, which may be one or more conveyor belts or rollers on one or more levels, or some other conveyor system. Each movable tray 10 can hold one or more motherboards, such as two motherboards. Movable trays 10 with loaded motherboards are moved along as highway conveyor 330 moves to the right until movable tray 10 reaches parking and testing structures 350, 352.

Parking and testing structures 350, 352 each have multiple levels and an elevator. Motherboards on movable tray 10 are raised and lowered by the elevator and "parked" on an empty level. When a motherboard is parked on a level, the motherboard is plugged into power, which activates the motherboard to test the memory modules that were inserted into test sockets on the motherboard. Once testing is complete, the motherboard with its tested memory modules is removed from the parking level by the elevator and returned to the level of highway conveyor 330.

Movable trays 10 with tested memory modules are removed from parking and testing structures 350, 352 and moved along to the left by highway conveyor 330. Highway conveyor 330 may have a second level that moves to the left, or may have parallel tracks that move in a loop, or may reverse direction. When the tested motherboards in movable tray 10 reach the unloading station at the far left, unloader 344 uses a robotic arm to remove the tested memory modules from the test sockets on the motherboards in movable tray 10. The tested memory modules are sorted into failing and passing trays, with passing memory modules placed on output tray 342. The passing memory modules on output tray 342 may be sent to the shipping department.

A host controller or computer at unloader 344 can receive test results from another computer that controls testing at parking and testing structures 350, 352. The test results are used to sort the tested memory modules.

The movable tray 10 holding motherboards with empty test sockets is moved by highway conveyor 330 from unloader 344 to loader 348. Loader 348 then inserts new memory modules into the empty test sockets on the motherboards. The test cycle can then begin again.

FIG. 4 is a side view of a parking and testing structure. Elevator 270 raises and lowers motherboard substrate 30 on movable tray 10 on elevator table 276.

Untested memory modules in motherboard substrate 30 are moved by movable tray 10 from input highway 332 to elevator 270, which lifts movable tray 10 and motherboard substrate 30 to one of the many parking levels in parking and testing structure 350. Each parking level has a parking conveyor 280, which holds movable tray 10. At the selected level, elevator 270 pushes movable tray 10 off of elevator table 276 and onto parking conveyor 280.

The memory modules inserted into motherboard substrates 30 are tested at test stations 20 located at the end of parking conveyors 280. Once testing is completed, parking conveyor 280 pushes movable tray 10 and motherboard substrate 30 onto elevator table 276 when elevator 270 is aligned with that parking level. Elevator 270 returns to the level of output highway 334, and elevator 270 forces movable tray 10 off of elevator table 276 and onto output highway 334. Output highway 334 then moves movable tray 10 to unloader 344 of FIG. 3.

Input highway 332 and output highway 334 can be part of highway conveyor 330 of FIG. 3. For example, input highway 332 and output highway 334 can be conveyors that form a continuous loop with unloader 344 and loader 348. When a movable tray reaches the right end of output highway 334, the movable tray is turned onto or lifted up to input highway 332 and continues to move to the right. When a movable tray reaches the right end of input highway 332, the movable tray is turned onto or dropped down by elevator 270 to output highway 334 and continues to move to the right.

Figure 5D:
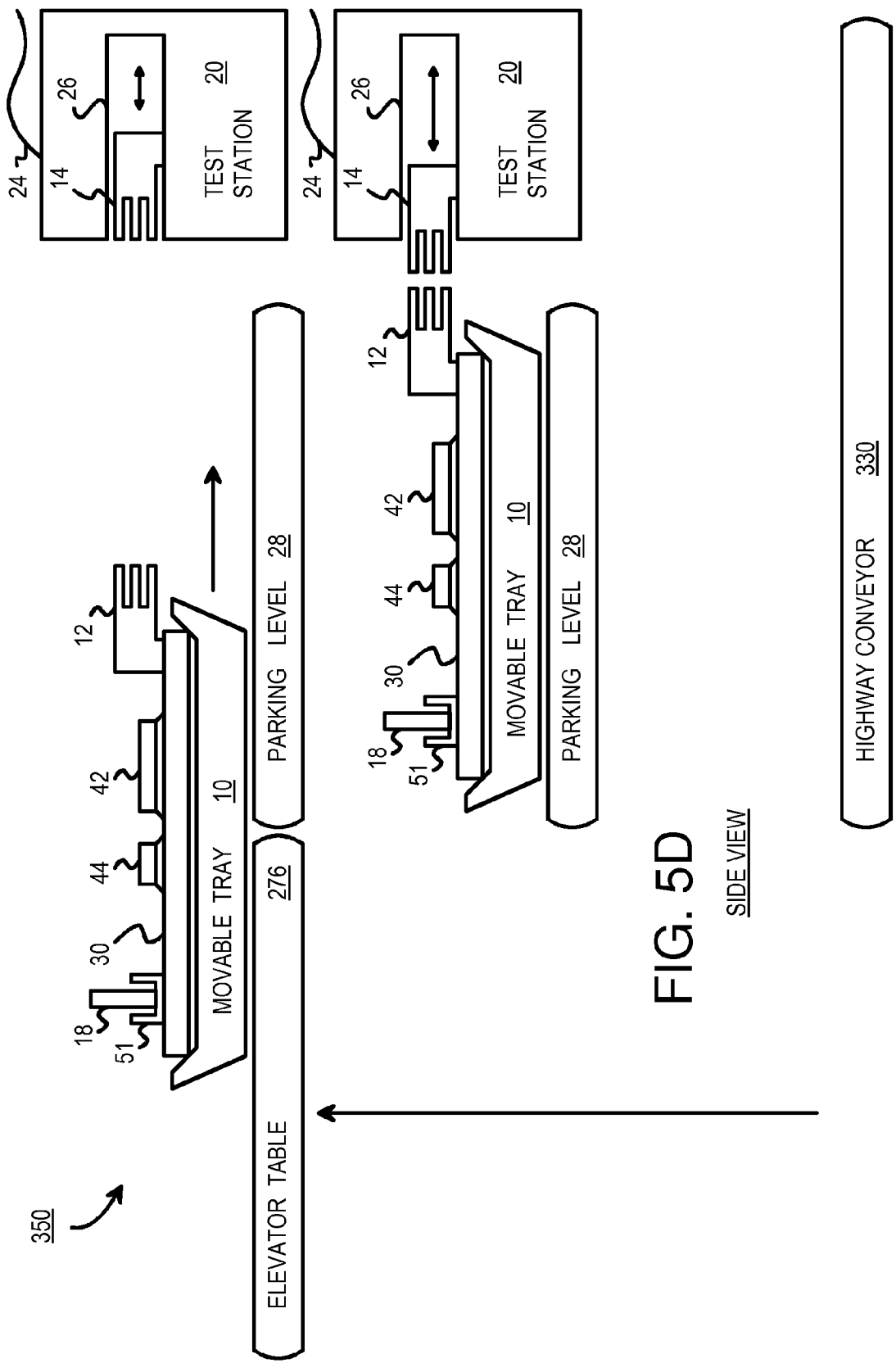

FIGS. 5A-E are side views of raising a motherboard to a parking level for testing in a parking and testing structure. In FIG. 5A, two parking levels 28 are shown, but many parking levels may be present in a parking and testing structure 350. Each parking level 28 is a parking conveyor that can hold movable tray 10. Movable tray 10 has one or more motherboard substrate 30. Motherboard substrate 30 is a PC motherboard that uses memory module 18 inserted into test socket 51 as the main memory that is accessed by a microprocessor and other components 42, 44.

Each test station 20 has a retractable connector 14 that mates with motherboard connector 12 on motherboard substrate 30 to apply power to the motherboard. Test results generated by motherboard substrate 30 testing memory modules 18 are sent through connectors 12, 14 to test station 20, and then communicated over Ethernet 24 or another network bus to a host controller.

In FIG. 5A, movable tray 10 on the lower level is being moved from highway conveyor 330 toward elevator table 276 in elevator 270 of FIG. 4. Elevator table 276 is aligned with highway conveyor 330. In FIG. 5B, movable tray 10 is fully pushed onto elevator table 276 by highway conveyor 330.

In FIG. 5C, elevator 270 is lifting or raising elevator table 276 toward the top level. In FIG. 5D, elevator table 276 has reached the top level, and movable tray 10 is pushed off of elevator table 276 and onto parking level 28.

In FIG. 5E, when the parking conveyor on parking level 28 moves movable tray 10 against test station 20, retractable connector 14 is extended from well 26 to make contact with motherboard connector 12. Test station 20 then applies power to motherboard substrate 30 through retractable connector 14 and motherboard connector 12, and components 42, 44 are activated, causing the microprocessor to boot and begin executing instructions in a boot routine stored in a ROM.

During this boot routine, memory addresses are generated and sent to memory module 18, which was earlier inserted into test socket 51 by a robotic arm at loader 348 of FIG. 3. The boot routine writes and reads memory locations in memory module 18 to determine if memory module 18 is faulty or good. Additional test routines may be activated to more extensively test memory module 18, or power may be cycled on and off to motherboard substrate 30 to repeatedly test memory module 18, such as for burn-in testing.

After testing is complete, results may be detected by test station 20 over retractable connector 14 and sent to the host controller over Ethernet 24. Test station 20 retracts retractable connector 14 into well 26, and movable tray 10 may then be moved along the parking conveyor at parking level 28, carrying motherboard substrate 30 away from test station 20 toward elevator table 276.

Test station 20 is out of the reach of the robotic arm. Motherboard substrate 30 must be carried by movable tray 10 down elevator 270 and along highway conveyor 330 to return to unloader 344 so that the robotic arm may remove memory module 18 from test socket 51.

Figure 6C:
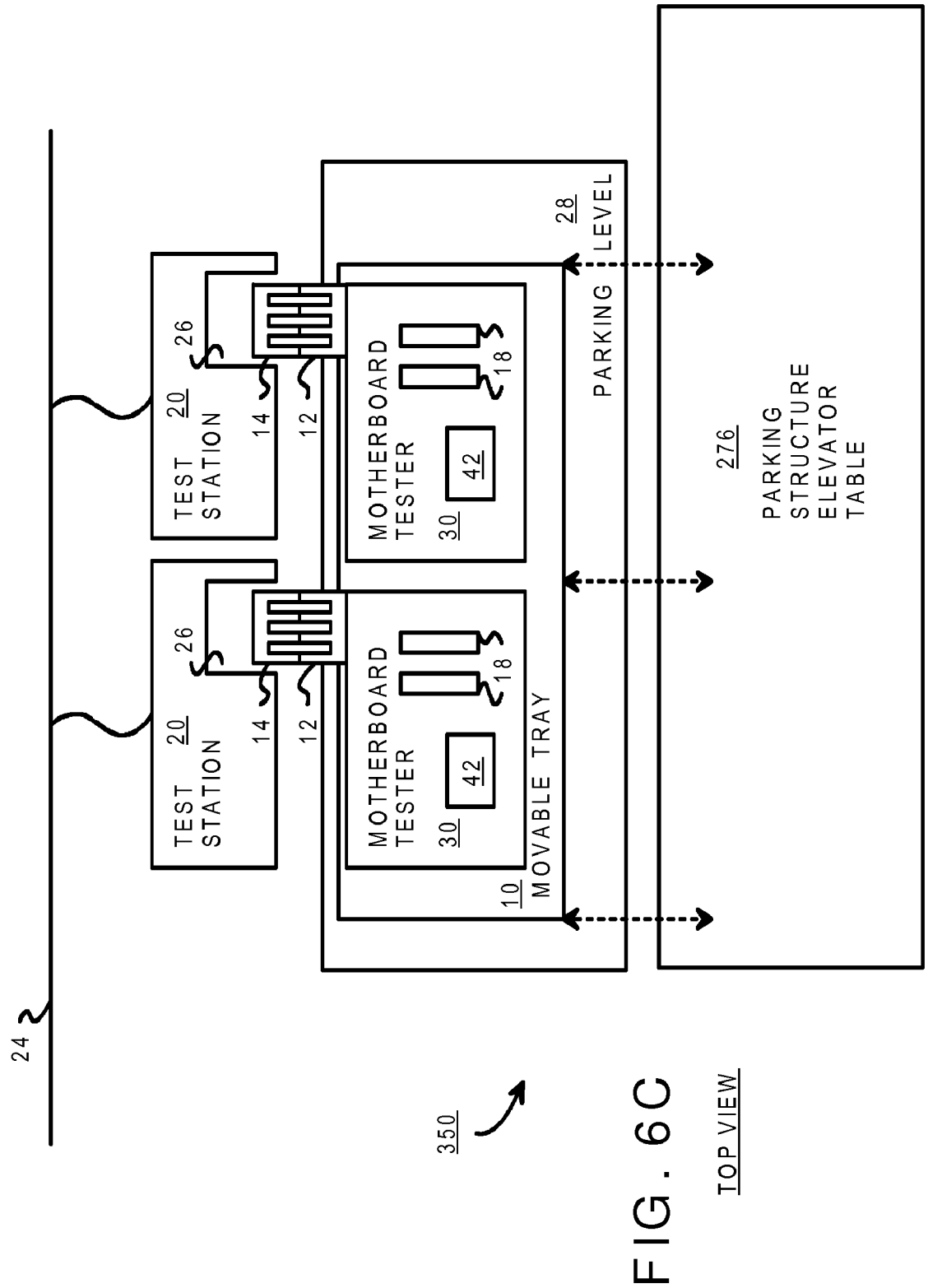

FIGS. 6A-C are top views of testing a motherboard in a movable tray at a parking level in the parking and testing structure. In FIG. 6A, movable tray 10 is raised to the level of parking level 28 by elevator table 276. Movable tray 10 holds two motherboard substrates 30, each with memory modules 18 inserted into test sockets.

Movable tray 10 is forced off of elevator table 276 and onto parking level 28, such as by a roller, pushing rod, forklift mechanism, or other method. In FIG. 6B, movable tray 10 has moved off of elevator table 276 and onto parking level 28. A parking conveyor or other movement device forces movable tray 10 to the back of parking level 28 near test station 20.

Once movable tray 10 and motherboard substrate 30 are aligned the host controller or parking structure controller may instruct test station 20 to extend retractable connector 14 from well 26. Retractable connector 14 then makes contact with motherboard connector 12, as shown in FIG. 6C. Power and ground connect from test station 20 to motherboard substrate 30, causing motherboard substrate 30 to power up and re-boot or otherwise initialize. During booting, the CPU on motherboard substrate 30 writes and reads to locations in memory modules 18, thus testing memory module 18. Further test programs may be executed by motherboard substrate 30 after booting. The results of these tests are reported back to test station 20 through motherboard connector 12 and retractable connector 14, and test station 20 reports the test results back to the host controller over Ethernet 24. After testing, retractable connector 14 is again retracted into well 26, breaking the electrical connection to motherboard substrate 30.

Test results can be communicated from motherboard substrate 30 to test station 20 through connectors 12, 14, which may have a serial link, differential lines, or a full Ethernet connection.

FIG. 7 shows the loader-unloader in more detail. A stack of manufacturing trays are received from a manufacturing or assembly line as input tray stack 347. Loader elevator 349 removes one manufacturing tray from input tray stack 347 and exposes the memory modules in that tray to robotic arm 364. Robotic arm 364 removes four memory modules from the manufacturing tray exposed by loader elevator 349 and inserts these memory modules into SPD programmer 356. SPD programmer 356 performs a simple open/shorts D.C. test on these memory modules, and then programs the SPD-EEPROM on each module with various information, such as the size and configuration of the memory, and an identification of the memory manufacturer. Memory modules that fail the open/short test, or fail to verify after SPD programming are moved by robotic arm 364 to reject tray 358. These defective memory modules may be reworked, recycled, or disposed of.

Memory modules that pass the open/shorts test and successfully program are picked up by robotic arm 364 from SPD programmer 356. Two of the memory modules are inserted into two test sockets on one motherboard and the other two memory modules are inserted into two test sockets on another motherboard on movable tray 10 by robotic arm 364. Movable tray 10 with the loaded motherboards can then be moved by highway conveyor 330 to parking and testing structure 350 for testing.

After testing by the motherboards at parking and testing structure 350, movable tray 10 is returned from parking and testing structure 350 by highway conveyor 330. Robotic arm 364 then removes the memory modules from the test sockets on the motherboards in movable tray 10 and places these memory modules into an output tray that is exposed by unloader elevator 345. Any defective memory modules that failed the motherboard test are moved by robotic arm 364 to reject tray 358.

Host controller 362 can be a personal computer that controls robotic arm 364. Test results from a parking structure PC that controls testing in parking and testing structure 350 can be sent over a local network such as an Ethernet to host controller 362, which later matches test results with memory modules picked up by robotic arm 364 from movable tray 10. Host controller 362 could track movements of all movable trays 10 and store test results for each tracked movable tray 10.

Once the output tray exposed by unloader elevator 345 is full, unloader elevator 345 can move the full output tray to output tray stack 343. A stack of output trays can them be removed and sent to shipping.

FIG. 8 shows an alternate embodiment of the parking and testing structure. In this embodiment, input highway 332 is located one level above output highway 334. Each level reached by elevator table 276 in elevator 270 has two parking conveyors 280 in opposite directions. Another alternative is to have four parking conveyors 280 for each parking level, with two more parking conveyors 280 (not shown) perpendicular to the plane of the drawing page.

Test station 20 is located at the end of each parking conveyor 280, even at the two levels used by highway conveyor 330.

Many motherboard substrates 30 may be activated in parallel to test memory modules. For example, when there are 4 test stations 20 per parking level, and 10 parking levels of parking conveyor 280, a total of 40 motherboards may be testing memory modules at any particular time in each parking and testing structure 350. Having two parking and testing structures 350, 352 can double testing to 80 motherboards. A single robotic arm 364 may thus be shared for use with all 80 motherboards, thus reducing the per-unit-tested cost of robotic arm 364.

This is ideal for slower test routines. A large number of motherboard-based testers are used, with only a single robotic arm. Thus the cost of the robotic arm is spread over a large number of inexpensive motherboards, reducing test costs.

FIG. 9 is an elevator that raises and lowers movable motherboard-based testers. Wheels 402 rotate to cause belts 408 to rotate in opposite directions. The left belt 408 rotates in a counter-clockwise fashion, while the right belt 408 rotates in a clockwise fashion.

Belts 408 have brackets 404 attached to them. Brackets 404 support elevator tables 406, which are inserted at the bottom and removed at the top. Movable tray 10 can be moved onto elevator table 406 and lifted into the desired level before being removed. Table 406 does not need to physically exist in some embodiments. For example, brackets 404 can be extended to support tray 10. Alternately, table 406 can be made part of tray 10, such as by a side protrusion from tray 10 for insertion into bracket 404.

Since this elevator moves in only one direction, a pair of elevators may be used. Alternately, wheels 402 may be rotated in a reverse direction to lower movable tray 10 so that the elevator may move in both up and down directions.

Figure 10:
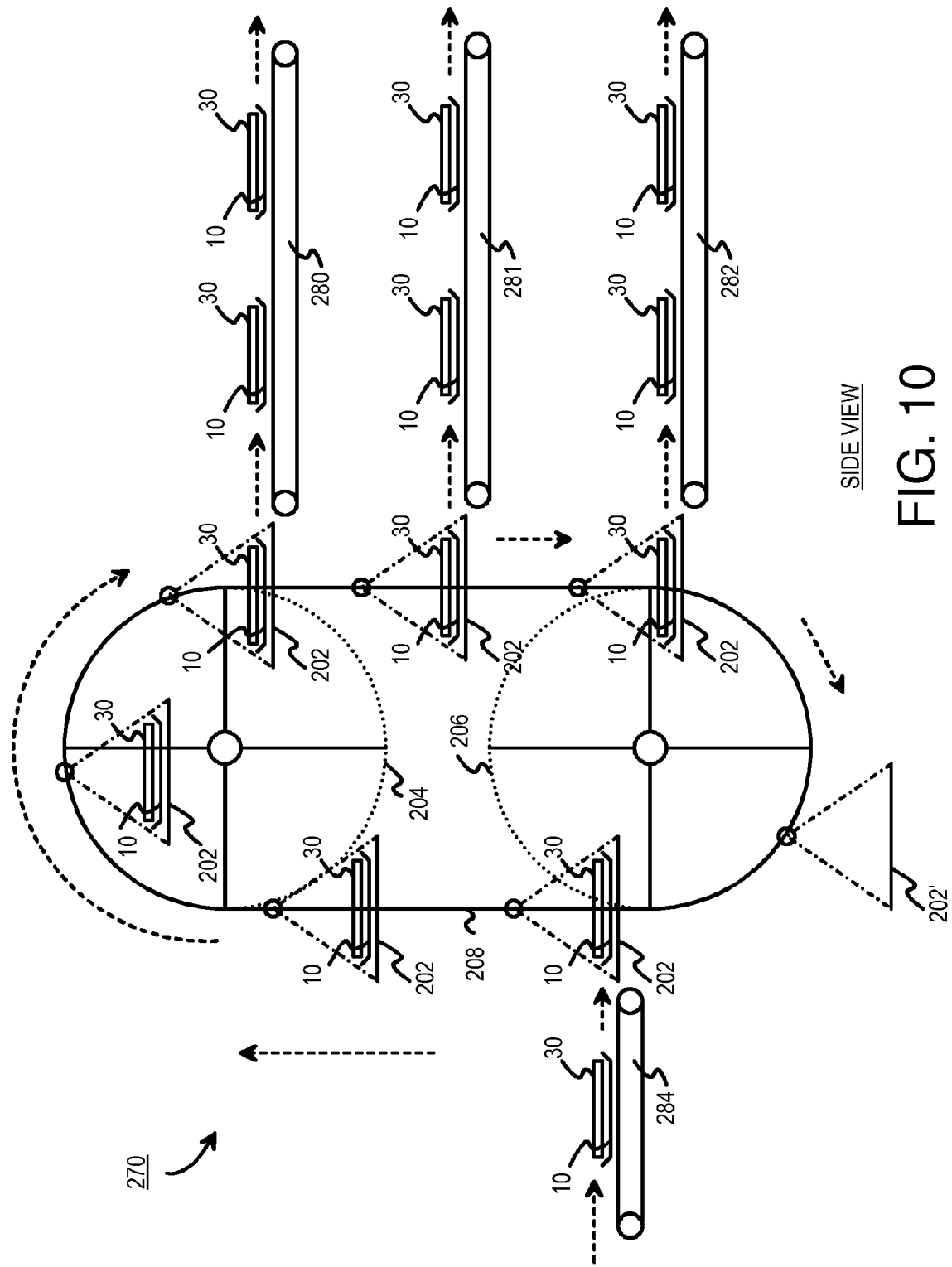
FIG. 10 is a diagram of a Ferris-wheel type of elevator.

FIG. 10 is a diagram of a Ferris-wheel type of elevator. Wheels 204, 206 rotate, causing chain 208 to rotate in a looping fashion. Chain 208 has several baskets 202 attached to it that can swing freely. Each basket 202 can hold one movable tray 10 with a motherboard substrate 30 in it.

When a basket 202 reaches the end of input conveyor 284, a movable tray 10 may be moved from input conveyor 284 onto basket 202. A loaded basked 202 may be unloaded when reaching one of conveyor belts 280, 281, 282. Empty baskets 202' are then returned to be reloaded from input conveyor 284. Wheels 204, 206 may be paused to allow loading and unloading of baskets 202. Activated-rods may be used to push movable tray 10 on and off of baskets 202. A forklift-type mechanism may be used as well.

Alternate Embodiments

Several other embodiments are contemplated by the inventors. While conveyor belts have been described, conveyors may not use belts, but may use rollers, escalators, or other type of conveying apparatus for moving objects. Elevator 270 could be a single elevator with a larger elevator table that could hold two movable trays 10 at a time. Hydraulics could be used to raise or lower the elevator table, or a cable or chain driven by a motor as in a conventional elevator. A solenoid, gears, or other mechanism may be used to move retractable connector 14.

While a retractable connector has been described, retractable connector 14 could be fixed in place, and the motherboard connector pressed into the retractable connector when movable tray 10 and the motherboard are moved to the end of the parking conveyor. More than one test station 20 could be located per parking level, and the parking conveyor or highway conveyor could have junctions, diverters, joints, etc.

Movable tray 10 could hold only 1 motherboard, or could hold more than 1 motherboard. Different sizes and form factors of the motherboards could be supported by movable tray 10. Also, movable tray 10 could be fixatedly attached to the motherboard or could be integrated with the motherboard, or the motherboard could be freely positioned in movable tray 10. The motherboard might have a tray attached to it, or a carrier of some sort that prevents the motherboard from shoring to any metallic parts of the conveyor system. Movable tray 10 can be made from an insulating material to prevent shorting of the motherboard to the conveyor. The conveyor system can be a standard conveyor such as used for moving boxes or other items, or may be more specialized. Such conveyer systems may include turns, bends, rotates, branching, lifts, etc.

Buffers can be added at various locations, such as on highway conveyor 330. Buffers can be implemented as additional conveyors that can hold a variable number of motherboards. The elevator wait delay may be reduced using buffers or other queues.

Additional buffers, rotators, elevators, or other components could be added at various locations. The number of levels in a conveyor stack may vary, and the number of parallel conveyor stacks may also vary. While testing memory modules has been described, other components could be tested as the MUT. Hot or cold air could be applied to the MUT while the motherboard is stationary at test station 20. MUT's could also be pre-heated at an earlier station on the conveyor.

Input highway 332 and output highway 334 could be connected to the elevators at any level, rather than at the lowest level. Connection to a middle level could reduce elevator delay.

Multiple highway conveyors 330 could be used, perhaps with multiple loading and unloading stations. Rather than have a single robotic arm, two or more robotic arms could be used. Each robotic arm could pick and place one or more memory modules.

Local heaters could be mounted on the motherboard substrate or on test station 20. Radiant heat sources could be used or a resistive element. Radiant elements could directly heat the memory module.

Many kinds of memory modules can be tested. Modules using standard DRAM or newer EDO and synchronous DRAM can be tested. The system is ideally suited for testing the highest-speed memory modules, since capacitive loading is minimized. Other memories such as RAMBUS modules, DDR modules, and PC133 synchronous modules can be tested. Other kinds of electronic devices could be tested, such as SD memory cards, USB flash drives, and solid-state hard drives. Testers are not limited to motherboard-based testers, but may include other kinds of testers that can be placed on a conveyor.

Various sizes of memory in the memory module, and form factors for memory modules can be used with the invention, limited by the test adaptor board and well size. Different kinds of test adaptor boards can be substituted. The reverse-mounting of the test adaptor boards and the solder-side up arrangement of the test station allows a technician or operator to easily replace the test adaptor boards when necessary. The test adapter board can also be mounted to the motherboard in a substantially perpendicular orientation. See for example, U.S. patent application Ser. No. 10/249,841, "Robotic Memory-Module Tester Using Adapter Cards for Vertically Mounting PC Motherboards", now U.S. Pat. No. 7,509,532. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

While FIGS. 5, 6, 9 show the component side of motherboard substrate 30 facing upward, the component side could face downward in movable trays 10, allowing a test adaptor board mounted to the solder-side of the motherboard to face upward. This arrangement may assist the robotic arm in reaching the test sockets on the test adaptor board. An extender card could be used to raise the level of the test sockets with or without a test adaptor board.

A Yamaichi type connector could be used as the test socket, as motherboard connector 12, or as retractable connector 14. A production-quality connector/socket is preferred due to the low insertion force required. A production quality connector/socket can take more insertions (greater than 100,000 times) than conventional sockets on motherboards (rated for 100 insertions). A production socket may also have an ejector normally located at the edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module. Motherboard connector 12 and retractable connector 14 could also employ self-alignment or positioners.

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory module to allow it to be warmed up by hot air. Memory modules could also be pre-heated by blowing hot air onto modules waiting to be inserted and tested. The input tray could be heated to accomplish this.

Many kinds of robotic arms and tracking systems can be employed, with different degrees of motion. Different grasping technologies can be used to hold the memory modules in the robotic arm. Multiple robotic arms that operate in tandem or independently can be used with the loader and unloader. For example, one arm can load modules into the motherboards, while a second arm unloads tested modules.

While separate loader and unloaders have been described, a single loading station could be substituted. The movable tray could remain stationary at the loading station for both unloading and loading. Alternately, the movable tray could be unloaded at one position, then moved to another position for loading as described in FIG. 3. The term loader-unloader includes both separate loading and unloading positions, and a unified loading and unloading position.

One operator may be able to operate several test stations, depending on how quickly trays need to be inserted and removed. Multiple arms can be attached to robot arm assembly 364, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the host controller or main system interface.

A network controller card on the ISA or PCI bus that communicates with the main system interface (host controller 362) can be adapted for other buses and is not limited to existing buses. The controller card can be replaced by a standard parallel or serial-port interface to the main system interface. FireWire, USB, Ethernet, or other emerging standards can be used for the interfaces.

Cold air rather than hot air could be blown onto the memory module. This might be useful for characterizing modules rather than for guard-band testing. Humid hot air could be used for testing hermetic seals of memory chips on the memory module, and even hot and cold air cycling could be done for reliability testing. The air may be recycled and re-blown through the channel by a blower or other air-flow system.

The test results could be stored in a non-volatile memory on the motherboards, such as in a battery-backed memory or an electrically-erasable programmable read-only memory, EEPROM, or in the SPD memory on the memory module. Then unloader 344 would power up the motherboard or memory module to read the test results. An SPD reader near unloader 344 can also be used to read the test results.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multi-level test system for testing electronic devices on movable electronic testers comprising:
   a plurality of electronic testers;
   test sockets on the plurality of electronic testers, the test sockets for receiving electronic devices for testing;
   a loader-unloader for inserting electronic devices into test sockets on electronic testers in the plurality of electronic testers when the electronic testers are at a loading station;
   a parking-testing structure having a plurality of parking levels, each parking level for temporarily holding an electronic tester in the plurality of electronic testers during testing of the electronic devices in the test sockets;
   a plurality of test stations, for connecting to electronic testers in the plurality of electronic testers and for activating the electronic testers to test the electronic devices inserted into the test sockets on the electronic testers;
   wherein each parking level in the plurality of parking levels has a test station in the plurality of test stations that connects to an electronic tester in the plurality of electronic testers that is currently parked on each parking level;
   a conveyor for moving the plurality of electronic testers from the loading station to the parking-testing structure, and for moving the plurality of electronic testers from the parking-testing structure to the loading station after testing by the plurality of test stations,
   whereby the electronic devices are inserted into electronic testers that are moved by the conveyor to the parking-testing structure for testing, and wherein the conveyor moves electronic testers back to the loading station after testing.

2. The multi-level test system of claim 1 further comprising:
   movable trays that are placed on the conveyor, each movable tray for holding an electronic tester in the plurality of electronic testers, each movable tray moving along the conveyor to transport the electronic tester from the loading station to the parking-testing structure, and to return the electronic tester to the loading station after testing.

3. The multi-level test system of claim 2 wherein the movable trays electrically insulate the plurality of electronic testers from the conveyor during testing by the plurality of test stations.

4. The multi-level test system of claim 1 further comprising:
   test adaptor boards, each coupled to an electronic tester in the plurality of electronic testers, the test adaptor boards having the test sockets for receiving electronic devices for testing by the electronic testers, each test adaptor board for electrically connecting an electronic device inserted into a test socket to an electronic tester attached to the test adaptor board.

5. The multi-level test system of claim 4 wherein circuit boards of the electronic testers have a component side and a solder side, the component side having integrated circuits mounted thereon;

wherein the test adaptor boards are mounted to the solder side of circuit boards of the electronic testers.

6. The multi-level test system of claim 1 further comprising a parking structure system interface, coupled to the plurality of test stations in the parking-testing structure, for commanding test stations in the plurality of test stations to apply power to activate electronic testers to test electronic devices inserted into the test sockets and for receiving test results from the electronic testers;

a main system interface for controlling the loader-unloader to sort electronic devices based on the test results;

a network between the parking structure system interface and the main system interface, for communicating the test results from the parking-testing structure to the loader-unloader;

wherein the main system interface stores the test results while the electronic tester is being returned from the test station to the loader-unloader after testing by the test station.

7. The multi-level test system of claim 6 wherein the loader-unloader further comprises:

a robotic arm, responsive to commands from the main system interface, for inserting electronic devices into the test sockets on electronic testers.

8. The multi-level test system of claim 1 wherein the parking-testing structure further comprises:

an elevator for raising and lowering an electronic tester to the plurality of parking levels of the parking-testing structure; and an input level of the elevator, the input level coupled to the conveyor between the loading station and the elevator.

9. The multi-level test system of claim 8 wherein the conveyor further comprises:

an input conveyor line between the loading station and the elevator;

an output conveyor line between the elevator and the loading station.

10. The multi-level test system of claim 9 wherein the input conveyor line and the output conveyor line are coupled to the elevator at different levels of the elevator, whereby the input conveyor line and the output conveyor line are on two different levels.

11. The multi-level test system of claim 9 further comprising a plurality of parking conveyors on the plurality of parking levels of the parking-testing structure, a parking conveyor for moving an electronic tester from the elevator to the test station before testing, and for moving the electronic tester from the test station to the elevator after testing.

12. The multi-level test system of claim 2 wherein each test station in the plurality of test stations further comprises:

a retractable connector for extending to make electrical contact with an electronic tester connector on an electronic tester.

13. A moving-electronic-tester electronic-device tester comprising:

a plurality of electronic testers, an electronic tester in the plurality of electronic testers for executing a test program to test an electronic device inserted into a test socket on the electronic tester;

a Device-Under-Test (DUT) loader-unloader having a robotic device that removes a tested electronic device from the test socket on the electronic tester, and that inserts an electronic device into the test socket on the electronic tester when the electronic tester is located at the DUT loader-unloader;

an input highway that moves the electronic tester away from the DUT loader-unloader after the electronic device has been inserted into the test socket;

an output highway that moves the electronic tester toward the DUT loader-unloader after the electronic device in the electronic tester has been tested;

an elevator that receives the electronic tester from the input highway, and that returns electronic testers to the output highway, the elevator raising and lowering the electronic testers to a plurality of parking levels;

a parking-testing structure having the plurality of parking levels accessible by the elevator, each parking level having a testing conveyor that receives electronic testers from the elevator;

a plurality of test stations in the parking-testing structure, each test station on a parking level having a parking connector that connects to an electronic tester connector on the electronic tester when parked at the parking level, the parking connector applying power to the electronic tester to activate the electronic tester to test the electronic device in the test socket; and a network connection to the plurality of test stations for communicating test results from the plurality of test stations testing the plurality of electronic testers, wherein the test results control the DUT loader-unloader to sort electronic devices when the robotic device removes the tested electronic devices, wherein test results indicating that the electronic device failed testing are sorted into a failed group of electronic devices while test results indicating that the electronic device passed testing are sorted into a passing group of electronic devices by the robotic device, whereby electronic devices are transported from the DUT loader-unloader to the plurality of test stations by the input highway, the elevator, the testing conveyor, and the output highway that move the plurality of electronic testers between test stations and the DUT loader-unloader.

14. The moving-electronic-tester electronic-device tester of claim 13 further comprising:

a plurality of movable trays that carry the plurality of electronic testers along the input highway, the elevator, the testing conveyor, and the output highway, whereby electronic testers are carried by the plurality of movable trays.

15. The moving-electronic-tester electronic-device tester of claim 14 further comprising:

a test adaptor board mounted to each electronic tester, wherein the test socket is mounted on the test adaptor board, the test socket for receiving an electronic device inserted by the robotic device.

16. The moving-electronic-tester electronic-device tester of claim 14 wherein the parking-testing structure comprises at least 5 parking levels and at least 10 test stations, wherein the parking-testing structure tests at least 10 electronic testers in parallel.

17. The moving-electronic-tester electronic-device tester of claim 16 wherein the plurality of parking levels in the parking-testing structure are located vertically above each other, whereby floor space is minimized.

18. The moving-electronic-tester electronic-device tester of claim 13 wherein each test station further comprises:
- a test-station connector that makes electrical contact with an electronic tester connector on the electronic tester;
- wherein power is applied through the test-station connector and the electronic tester connector by the test station when testing the electronic device on the electronic tester.

19. A multiple-electronic-tester parking-testing structure electronic tester comprising:
- host system means for controlling testing of electronic devices on multiple electronic testers and for controlling movement of electronic testers by conveyors;
- test socket means for receiving an electronic device for testing;
- conveyed electronic tester means, controlled by the host system means, for executing a test program on an electronic device inserted into the test socket means;
- wherein the multiple-electronic-tester parking-testing structure electronic tester has a plurality of the conveyed electronic tester means, each conveyed electronic tester means for executing the test program on a different electronic device in parallel with other electronic tester means;
- robotic means, controlled by the host system means, for grasping an electronic device and inserting the electronic device into the test socket means, the robotic means also for grasping and removing the electronic device from the test socket means after completion of the test program, and moving the electronic device to an output means for storing tested electronic devices when the conveyed electronic tester means indicates to the host system means that the electronic device has passed the test program;
- test station means for applying power to the conveyed electronic tester means to activate the conveyed electronic tester means to test the electronic device inserted into the test socket means;
- parking-testing structure means for parking a plurality of the conveyed electronic tester means on a plurality of parking levels, each parking level having at least one test stations means, wherein the plurality of parking levels overlap each other to occupy a same floor space;
- wherein the plurality of parking levels and the test station means are not accessible by the robotic means;
- elevator means for raising and lowering the conveyed electronic tester means on an elevator table to the plurality of parking levels in the parking-testing structure means; and
- conveying highway means, coupled between the elevator means and a loading station that is accessible by the robotic means, for moving the conveyed electronic tester means from the loading station to the elevator means before testing, and for moving the conveyed electronic tester means from the elevator means to the loading station after testing,
- whereby electronic testers are moved from the loading station to a parking level in the parking-testing structure means before testing, and moved from the parking-testing structure means back to the loading station after testing.

20. The multiple-electronic-tester parking-testing structure electronic tester of claim 19 further comprising:
- tray means for holding the conveyed electronic tester means during transport between the loading station and the test station means.

* * * * *